US 6,617,682 B1

(12) United States Patent
Ma et al.

(10) Patent No.: US 6,617,682 B1
(45) Date of Patent: Sep. 9, 2003

(54) STRUCTURE FOR REDUCING DIE CORNER AND EDGE STRESSES IN MICROELECTRONIC PACKAGES

(75) Inventors: Qing Ma, San Jose, CA (US); Jim Maveety, San Jose, CA (US); Quan Tran, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,112

(22) Filed: Sep. 28, 2000

(51) Int. Cl.⁷ .............................. H01L 23/34; H05K 1/00
(52) U.S. Cl. ........................ 257/706; 257/713; 174/253
(58) Field of Search .................... 257/778, 787, 257/796, 706, 712, 713; 174/253

(56) References Cited

U.S. PATENT DOCUMENTS

| 5,646,826 A | * | 7/1997 | Katchmar ............... 361/704 |
| 5,735,340 A | | 4/1998 | Mira et al. |
| 5,777,847 A | | 7/1998 | Tokuno et al. |
| 5,796,582 A | * | 8/1998 | Katchmar ............... 361/704 |
| 5,851,337 A | | 12/1998 | Chen |
| 5,909,057 A | | 6/1999 | McCormick et al. |
| 6,002,171 A | | 12/1999 | Desai et al. |
| 6,015,722 A | | 1/2000 | Banks et al. |
| 6,016,006 A | * | 1/2000 | Kolman et al. ............ 257/712 |
| 6,081,037 A | | 6/2000 | Lee et al. |
| 6,114,761 A | * | 9/2000 | Mertol et al. ............. 257/722 |
| 6,157,086 A | * | 12/2000 | Weber ..................... 257/788 |
| 6,281,573 B1 | * | 8/2001 | Atwood et al. ........... 257/706 |

OTHER PUBLICATIONS

PCT International Search Report, Apr. 19, 2002 (7 pages).

* cited by examiner

Primary Examiner—Kamand Cuneo
Assistant Examiner—Scott B. Geyer
(74) Attorney, Agent, or Firm—Blakely, Sokoloff, Taylor & Zafman LLP

(57) ABSTRACT

A microelectronic die is aligned with a package substrate and attached to it using solder balls. A specially shaped heat spreader, preferably with a coefficient of thermal expansion (CTE) similar to that of silicon, is attached to the back side of the die using a heat-conducting adhesive. An epoxy-based material is flowed into the gap between the die, the substrate, and the heat spreader via a through-hole in either the substrate or the heat spreader using a dispense process or a transfer molding process. By positioning the heat spreader to abut the die corners and/or edges, the stresses on the die are substantially reduced or eliminated.

16 Claims, 2 Drawing Sheets

STRUCTURE FOR REDUCING DIE CORNER AND EDGE STRESSES IN MICROELECTRONIC PACKAGES

FIELD OF THE INVENTION

The present invention relates generally to the field of electronic microcircuit fabrication and, more particularly, to a structure and process for reducing die corner and edge stresses in microelectronic packages.

BACKGROUND OF THE INVENTION

The miniaturization of electronic microcircuits has focused attention on packaging these devices in a more efficient and reliable manner. A typical electronic microcircuit includes a microelectronic die (i.e., a silicon chip) mounted to a carrier substrate with an epoxy-based material disposed between the die and the substrate. A heat spreader (e.g., aluminum Al or copper Cu) is typically included in the package and has direct contact with the die so that heat generated by the die can dissipate by convection directly into the surrounding air.

Because there is a mismatch in the coefficients of thermal expansion (CTE) between the die and the supporting packaging materials, electronic microcircuits suffer from stress problems. For instance, silicon has a CTE of about 3 parts per million per degree Celsius (ppm/.degree.C.) while the CTE of an organic substrate is generally 16 ppm/.degree.C. and that of a ceramic substrate is about 6.5 ppm/.degree.C. One undesired effect of thermal expansion can cause the central portion of a die, secured to a substrate, to curve or bend which causes some of the electrical connections between the die and the substrate to separate. Another damaging effect caused by thermally induced curving includes cracking and/or breaking of the die. In this instance, tensile stresses occur in the outer layer of the die as it bends. If these stresses are greater than the fracture strength of the die, it chips or breaks. These same thermal effects also appear in the substrate and other packaging materials.

One method of solving this problem has been to include epoxy-based encapsulation material (i.e., underfill) between the die and the substrate. In the commonly used flip-chip device, for example, the die is mounted face-down to a wiring substrate so that conductive terminals in the die (usually in the form of solder balls) are directly physically and electrically connected to the wiring pattern on the substrate. This underfill encapsulation material bonds the die to the substrate and thus lessens the stress in the solder balls to improve the performance of the die.

A limitation with this method, however, is the potential creation of voided areas in the underfill encapsulation material. If voiding occurs, the solder balls located in the void will be subjected to the same thermal fatigue as if the underfill encapsulation material were not there. Moreover, as the industry moves toward smaller electronic microcircuits it is becoming increasingly difficult to properly insert underfill encapsulation material into the gap between the die and the substrate.

Finally, manufacturers are moving away from aluminum oxide interconnects in the die to copper low-k materials. Although copper low-k materials speed up the interconnects, they are mechanically very weak. The effects of CTE induced stress will thus be much greater in the next generation of electronic microcircuits.

BRIEF DESCRIPTION OF THE DRAWINGS

The present invention is illustrated by way of example, and not limitation, in the figures of the accompanying drawings in which like reference numerals refer to similar elements and which.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative rather than a restrictive sense.

The present invention provides a structure and process for reducing die corner and edge stresses in microelectronic packages. At the first step of packaging, a microelectronic die is aligned with a package substrate and attached to it using solder balls. No underfill encapsulation material is applied at this stage of the process. Second, a heat spreader including two pillars surrounding the die is attached to the backside of the die using a heat conducting adhesive (i.e., grease, phase changing material, or solder alloy). It is preferred that the coefficient of thermal expansion (CTE) of the heat spreader be similar to that of silicon to minimize the stress between the die and the heat spreader. Finally, an epoxy-based encapsulation material (i.e., molding compound or underfill) is flowed into the gap between the die, the substrate, and the heat spreader by using a dispense process or a transfer molding process. In an embodiment, the encapsulation material is fed through an opening or gate formed in the substrate or the heat spreader. A vent hole in the substrate or the heat spreader allows air to escape from a gap between the die, the substrate, and the heat spreader as the encapsulation material is fed through the opening.

By using a heat spreader with CTE characteristics similar to that of silicon and by requiring the side-gap between the die and the heat spreader to be small (under 100 microns), the die shear stresses are significantly reduced because they are transferred to the heat spreader. In this configuration, the heat spreader acts as a stress shield for the die, solder balls, and underfill material. Another advantage is that if grease or phase changing material is used they are sealed, which ensures that the integrity of the thermal interface between the die and the heat spreader is always maintained.

Figure 1:
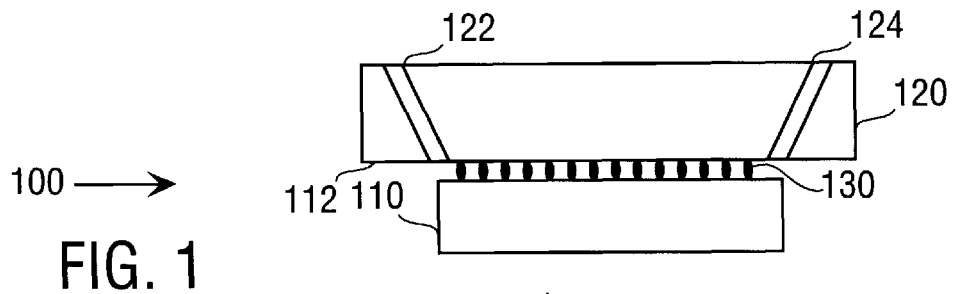
FIG. 1 is a schematic illustration of a first step of a packaging process wherein a microelectronic die is aligned with a package substrate including a through-hole and a vent hole according to an embodiment of the present invention.

Referring now to FIG. 1, there is shown a schematic illustration of a first step of a packaging process wherein a microelectronic die is aligned with a package substrate including a through-hole 122 and a vent hole 124 in accordance with an embodiment of the present invention. The die 110 may be aligned with the substrate 120 and connected to the substrate 120 using an array of minute solder balls 130 comprised of generally lead or tin solder. The die 110 is mounted to the substrate 120 using a mounting technology called flip chip or C4 attachment ("Controlled Collapse Chip Connection"). A flip chip is a microelectronic die that has a pattern or array of terminations or bond pads, generally metal or metal alloy pads, spaced on an active surface of the flip chip. The array of minute solder balls is disposed on the flip chip bond pads. The flip chip is then positioned (i.e., flipped) such that the solder balls are aligned with an array of bond pads on an active surface of a carrier substrate. The carrier substrate bond pads are essentially in mirror-image placement to the flip chip bond pads. Of course, it should be noted that the solder balls may be formed on the carrier substrate bond pads, rather than the flip chip bond pads. The solder balls are then heated thereby reflowing them, such that when cooled the solder balls solidify to form conductive pillars between the flip chip bond pads and the carrier substrate bond pads. It should be noted that in the embodiment illustrated by FIG. 1, various other types of electrical connections between the die 110 and the substrate 120 may also be used. For instance, the die 110 may be mounted to the substrate 120 using Chip-on-Flex ("COF") packaging where a flex component (i.e., the carrier substrate) is attached with an adhesive layer to an active surface of a microelectronic die.

In practicing the invention, it should be noted that the functionality of the die 110 may vary. For example, the die 110 may be an analog device, a microprocessor, an application specific device, and the like. Moreover, the die 110 does not necessarily have to be a silicon die. For example, the die 110 may be a gallium arsenide die. The shape of the die 110 may also vary, so although a die 110 rectangular in shape is shown in the embodiment illustrated by FIG. 1, the die 110 may also be square, triangular, hexagonal, or any other conceivable shape. The die 110 and the substrate 120 typically have different CTE's.

Figure 5:
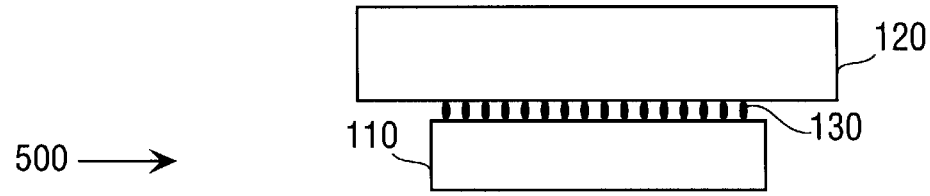
FIG. 5 is a schematic illustration of a first step of a packaging process wherein a microelectronic die is aligned with a package substrate according to an embodiment of the present invention.

In the embodiment illustrated by FIG. 1, the substrate 120 may be fabricated of laminates such as FR-4, fiberglass or bismaleimide-triazine (BT) material, of coated aluminum, or of alumina, ceramic, or other suitable material and includes multiple dielectric layers and multiple conductive layers (not shown in this view) which are laminated or co-fired between the varied dielectric layers. Conductors on the substrate 120 may be formed of metals, such as copper, aluminum, gold or silver, or by conductive inks formed by known technologies such as by thin-film or thick-film deposition. A through-hole 122 may extend from a first exterior surface 111 of the substrate 120 through to a second exterior surface 112 of the substrate 120 to enable the flow of an underfill encapsulation material (not shown in this view) between the die 110, the substrate 120, and a heat spreader (not shown in this view) as will subsequently be described in greater detail. A vent hole 124 may extend from a first exterior surface 111 of the substrate 120 through to a second exterior surface 112 of the substrate 120 to allow air to escape from between the die 110, the substrate 120, and the heat spreader as the underfill encapsulation material is dispensed through the through-hole 122. The through-hole 122 and the vent hole 124 may be formed through a drilling operation in an organic substrate and by punching in a ceramic substrate in a manner well known to those skilled in the art of substrate manufacturing. (See also FIG. 5 wherein a microelectronic die is aligned with a package substrate 500 (absent the through-hole 122 and the vent-hole 124)) according to an embodiment of the present invention. In the embodiment illustrated by FIG. 5, the underfill encapsulation material is fed through a through-hole and a vent hole in a heat spreader (not shown in this view) affixed to the die 110 as will be described in more detail herein).

Figure 2:
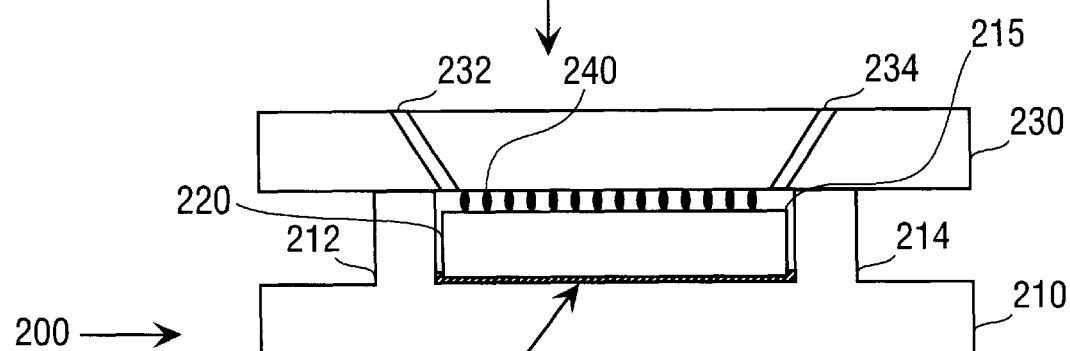
FIG. 2 is a schematic illustration of a second step of a packaging process wherein a heat spreader is attached to the backside of a die using a heat-conductive adhesive according to an embodiment of the present invention.

Referring now to FIG. 2, there is shown a heat spreader attached to the backside of a die using a heat-conductive adhesive 200 in accordance with an embodiment of the present invention. In the embodiment illustrated by FIG. 2, the heat spreader 210 is comprised of a material that has a CTE relatively close to that of the die 220 which is attached to the substrate 230 with solder balls 240. In order to minimize the stress between the die 220 and the heat spreader 210 for a silicon die, a heat spreader such as silicon carbide or silicon aluminum carbide is used. Of course, other thermally conductive materials—such as copper, aluminum, titanium, and the like—may also be used. The heat spreader 210 is attached to the back of the die 220 using heat conducting adhesive 225 (e.g., grease, phase changing material, or solder) to absorb any thickness variation and to provide the least thermal resistance. Portions of the heat spreader 210 in the form of pillars 212 and 214 surround the die 220, forming a rectangular or square shaped barrier around the die 220 and effectively shifting the CTE stress area to the heat spreader 210 rather than to the die 220. It should be noted that although rectangular shaped pillars 212 and 214 are used in the embodiment illustrated by FIG. 2 (thus matching the rectangular shape of the die 220), it is not necessary to use pillars 212 and 214 that are the same shape of the die 220. Moreover, although the dimensions of the pillars 212 and 214 in the present embodiment are approximately 1 mm. each, these dimensions may vary in other embodiments.

The functionality of the heat spreader 210 is imperative to the present embodiment. As:will be described in the embodiment illustrated by FIG. 3, the next step of the packaging process involves feeding an epoxy-based underfill material (not shown in this view) into a gap 215 between the die 220, the substrate 230, and the heat spreader 210. As the epoxy-based underfill material cools from the temperature of its liquid form (approximately 125 degrees C.) to room temperature, CTE induced stress will potentially cause the die 220 to chip or crack, resulting in damage to the interconnect layers (not shown in this view). By using a heat spreader with CTE characteristics similar to that of silicon and by requiring the side-gap 215 between the heat spreader 210 and the die 220 to be small (less than 100 microns), the problems associated with CTE induced stress on the die 220 are substantially reduced or eliminated. Another advantage is that if grease or phase changing material is used as the heat conducting adhesive 225 the integrity of the thermal interface bondline thickness between the die 220 and the heat spreader 210 is always maintained.

Figure 6:
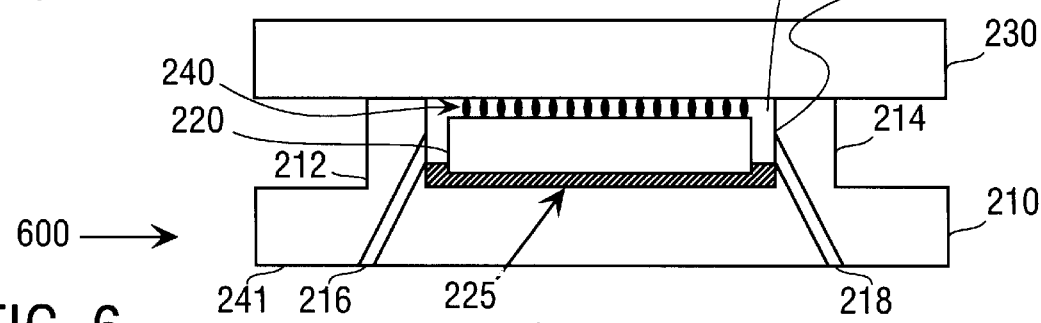
FIG. 6 is a schematic illustration of a second step of a packaging process wherein a heat spreader including a through-hole and a vent hole is attached to the backside of a die using a heat conductive adhesive according to an embodiment of the present invention.

In an alternative embodiment (See FIG. 6 wherein a heat spreader including a through-hole and a vent hole is attached to the backside of a die using heat conductive adhesive 600) a through-hole 216 and a vent hole 218 extend from a first exterior surface 241 of the heat spreader 210 through to a second exterior surface 242 of the heat spreader 210 (rather than the through-hole 232 and the vent hole 234 extending through the substrate 230) to enable the flow of an underfill encapsulation material (not shown in this view) between the die 220, the substrate 230, and the heat spreader 210 and to allow air to escape from between the die 220, the substrate 230, and the heat spreader 210 as the underfill encapsulation material is dispensed.

In yet another embodiment (not shown in this view), the underfill encapsulation material is fed through a through-hole in a heat spreader (or through a through-hole in a substrate) and the air escapes through a vent hole in the substrate (or through a vent hole in the heat spreader).

Figure 3:
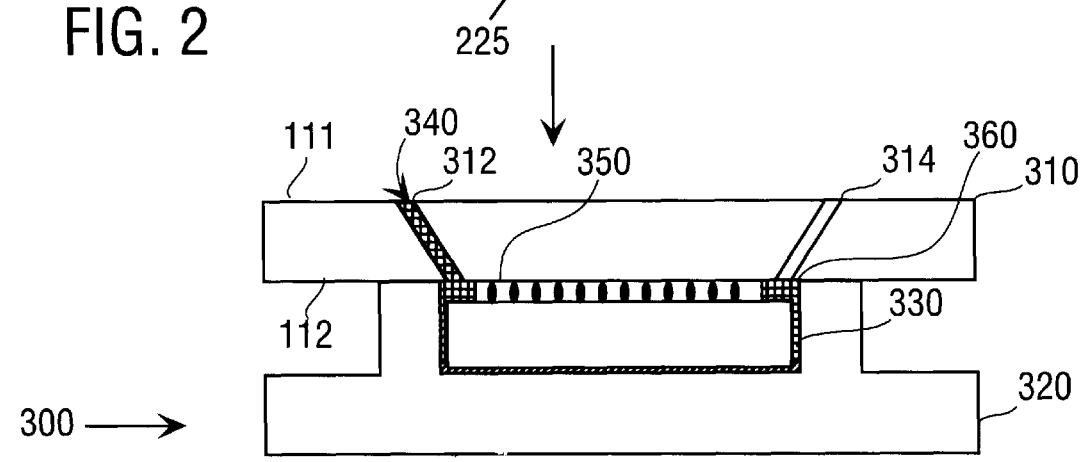
FIG. 3 is a schematic illustration of a third step of a packaging process wherein an epoxy-based material is injected via a through-hole in a package substrate into a gap between a die, a substrate, and a heat spreader according to an embodiment of the present invention.

Referring now to FIG. 3, there is shown a schematic illustration of a third step of a packaging process wherein an epoxy-based material is injected via a through-hole into a gap between a die, a substrate, and a heat spreader 300 in accordance with an embodiment of the present invention. Typically, a dispense process or a transfer molding process is used to insert the underfill encapsulation material 340 around the die 330 (which is attached to the substrate 310 with solder balls 350) through a through-hole 312 in the substrate 310. In the embodiment of the invention illustrated by FIG. 3, an epoxy-based resin mixture having at least two epoxy groups in a molecule and a curing agent thereof may be used for the underfill encapsulation material 340. It should be noted, however, that any of the commercially available materials sold for underfill applications may be used in conjunction with the present invention. Likewise, any type of commercially available dispensing equipment may be used in practicing the invention.

The underfill encapsulation material 340 is fed into the through-hole 312 and forced into the gap between the die 330, the substrate 310, and the heat spreader 320. The vent hole 314 extending from a first exterior surface 111 of the substrate 310 to a second exterior surface 112 of the substrate 310 allows air to escape from between the die 340, the substrate 310, and the heat spreader 320 as the underfill encapsulation material 340 is forced underneath the die 330. In this manner, air pockets are prevented from becoming trapped in the underfill encapsulation material 340. Alternatively, multiple vent holes (not shown in this view) may be used. The through-hole 312 and the vent hole 314 have a cross-sectional area which may vary depending on its location and the size of the die 330.

Figure 7:
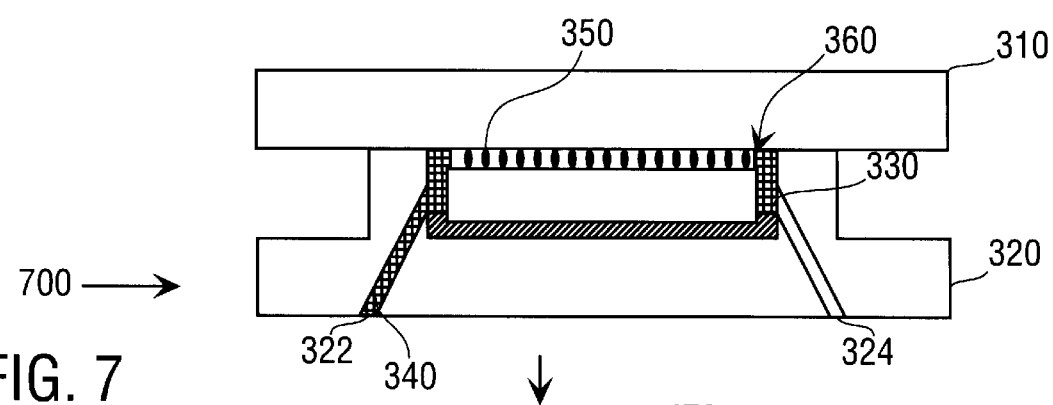
FIG. 7 is a schematic illustration of a third step of a packaging process wherein an epoxy-based material is injected via a through-hole in a heat spreader into a gap between a die, a substrate, and a heat spreader according to an embodiment of the present invention.

In an alternative embodiment (See FIG. 7 wherein an epoxy-based material is fed through a through-hole in a heat spreader into a gap between a die, a heat spreader, and a substrate 700) the underfill encapsulation material 340 is fed through a through-hole 322 extending through the heat spreader 320 (rather than through the substrate 310) and fills the gap 360 between the die 340, the substrate 310, and the heat spreader 320. A vent hole 324 extending through the heat spreader 320 (rather than through the substrate 310) allows air to escape from between the die 330, the substrate 310, and the heat spreader 320 as the underfill encapsulation material is dispensed.

In yet another embodiment (not shown in this view) the underfill encapsulation material is fed through a through-hole in a heat spreader (or, alternatively, through a through-hole in a substrate) and the air escapes through a vent hole in the substrate (or, alternatively, through a vent hole in the heat spreader).

Figure 4:
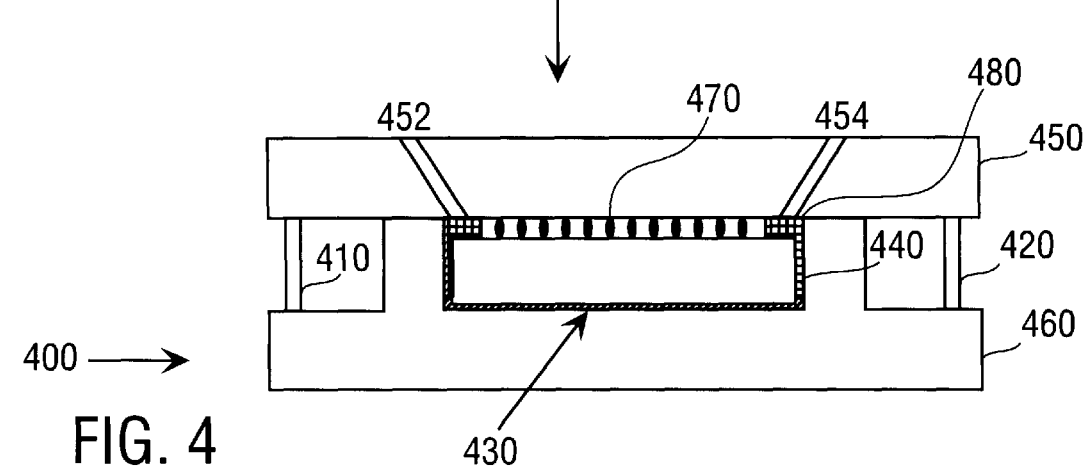
FIG. 4 is a schematic illustration of a final step of a packaging process wherein a mechanical reinforcement is implemented between a package substrate including a through-hole and a vent hole and a heat spreader in a final stage of a packaging process according to an embodiment of the present invention.
Figure 8:
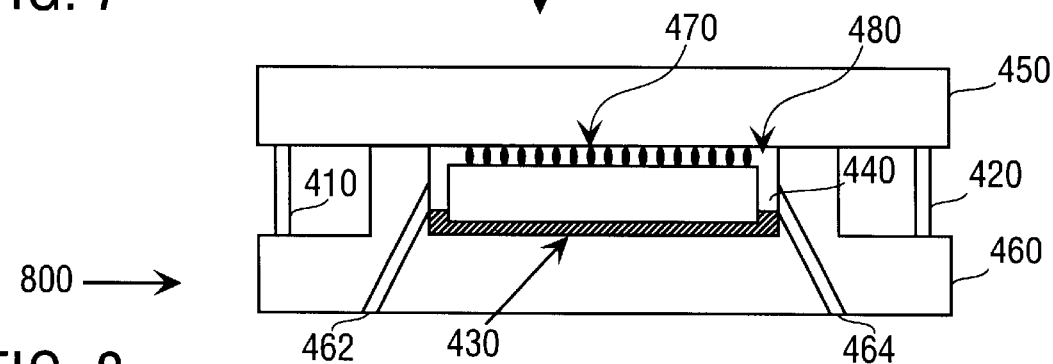
FIG. 8 is a schematic illustration of a final step of a packaging process wherein a mechanical reinforcement is implemented between a package substrate and a heat spreader including a through-hole and a vent hole in a final stage of a packaging process according to an embodiment of the present invention.

Referring now to FIG. 4 there is shown a schematic illustration of a final step of a packaging process wherein a mechanical reinforcement is implemented between a package substrate including a through-hole and a vent hole and a heat spreader 400 according to an embodiment of the present invention. Mechanical reinforcements 410 and 420 connect the substrate 450 to the heat spreader 460 and serve to make the packaging system mechanically more robust and also to provide a positive pressure on the heat conducting adhesive 430, which in turn improves the heat conduction from the die 440 to the heat spreader 460. Mechanical reinforcements 410 and 420 are essentially pillars attached to the substrate 450 and the heat spreader 460 using conventional fastening techniques known in the art of microelectronic fabrication. Mechanical reinforcements 410 and 420 may be fabricated from copper, aluminum, titanium, or other types of suitable metals. The through-hole 452 and the vent hole 454 extend through the substrate and, as explained herein, function to allow the underfill encapsulation material to fill the gap 480 between the die 440, the heat spreader 460, and the substrate 450. The die 440 is affixed to the substrate 450 using solder balls 470. (See also FIG. 8 wherein a mechanical reinforcement is implemented between a package substrate and a heat spreader including a through-hole and a vent hole in a final stage of a packaging process 800 according to another embodiment. The through-hole 462 and the vent hole 464 extend through the heat spreader 460).

Figure 9:
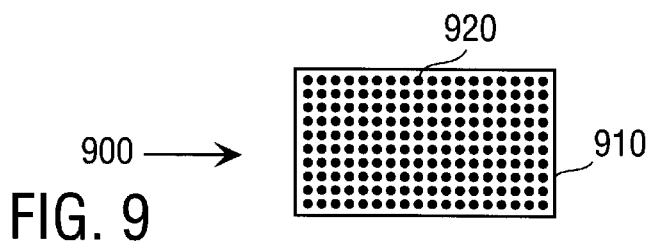
FIG. 9 is a schematic illustration of a backside of a microelectronic die according to an embodiment of the present invention.

FIG. 9 is a schematic illustration of a backside of a microelectronic die 900 according to an embodiment of the present invention. A die 910 may be aligned with the substrate (not shown in this view) and connected to the substrate using an array of minute solder balls 920 comprised of generally lead or tin solder. Of course, other conductive materials may be used as well.

Thus, a structure and process for reducing die, corner and edge stresses in microelectronic packages has been described. Although the foregoing description and accompanying figures discuss and illustrate specific embodiments, it should be appreciated that the present invention is to be measured only in terms of the claims that follow.

What is claimed:

1. A microelectronic package, comprising:
   a die;
   a substrate; and
   a heat spreader coupled to the backside of the die, the heat spreader including a plurality of pillars coupled to the substrate, such that thermally induced stress is shifted away from the corners and edges of the die and wherein a through-hole extends from a first exterior surface to a second exterior surface of the substrate, the through-hole configured to allow the flow of an underfill encapsulation material into a gap between the die, the substrate and the heat spreader.

2. The microelectronic package of claim 1 wherein the heat spreader is fabricated from a material having a coefficient of thermal expansion substantially equivalent to a coefficient of thermal expansion of the die.

3. The microelectronic package of claim 1 wherein the heat spreader is coupled to the die using heat conductive adhesive.

4. The microelectronic package of claim 1 wherein the plurality of pillars surrounding the die protect the corners and edges of the die from cracking due to thermally induced stress.

5. The microelectronic package of claim 1 wherein an active surface of the die is affixed to an active surface of the substrate, a plurality of solder balls disposed on an active surface of the die aligned with a plurality of bond pads disposed on an active surface of the substrate.

6. The microelectronic package of claim 1 wherein the substrate is fabricated from organic or ceramic material.

7. The microelectronic package of claim 1 wherein a vent hole extends from a first exterior surface to a second exterior surface of the substrate, the vent hole configured to allow air to escape from between the die, the substrate, and the heat spreader as the underfill encapsulation material is dispensed via the through-hole.

8. The microelectronic package of claim 1 wherein a vent hole extends from a first exterior surface to a second exterior surface of the heat spreader, the vent hole configured to allow air to escape from between the die, the substrate, and the heat spreader as the underfill encapsulation material is dispensed via the through-hole.

9. The microelectronic package of claim 1 wherein mechanical reinforcements connect the substrate and the heat spreader.

10. A microelectronic package, comprising:

a die;

a substrate; and a heat spreader coupled to the backside of the die, the heat spreader including a plurality of pillars coupled to the substrate, such that thermally induced stress is shifted away from the corners and edges of the die and wherein a through-hole extends from a first exterior surface to a second exterior surface of the heat spreader, the through-hole configured to allow the flow of an underfill encapsulation material into a gap between the die, the substrate and the heat spreader.

11. The microelectronic package of claim 10 wherein the heat spreader is fabricated from a material having a coefficient of thermal expansion substantially equivalent to a coefficient of thermal expansion of the die.

12. The microelectronic package of claim 10 wherein the heat spreader is coupled to the die using heat conductive adhesive.

13. The microelectronic package of claim 10 wherein the plurality of pillars surrounding the die protect the corners and edges of the die from cracking due to thermally induced stress.

14. The microelectronic package of claim 10 wherein an active surface of the die is affixed to an active surface of the substrate, a plurality of solder balls disposed on an active surface of the die aligned with a plurality of bond pads disposed on an active surface of the substrate.

15. The microelectronic package of claim 10 wherein the substrate is fabricated from organic or ceramic material.

16. The microelectronic package of claim 10 wherein mechanical reinforcements connect the substrate and the heat spreader.

* * * * *